(12) United States Patent
Chiang et al.

(10) Patent No.: US 11,699,718 B2
(45) Date of Patent: *Jul. 11, 2023

(54) SEMICONDUCTOR IMAGE SENSOR

(71) Applicant: TAIWAN SEMICONDUCTOR MANUFACTURING COMPANY LTD., Hsinchu (TW)

(72) Inventors: Wei-Chieh Chiang, Changhua County (TW); Keng-Yu Chou, Kaohsiung (TW); Chun-Hao Chuang, Hsinchu (TW); Wen-Hau Wu, New Taipei (TW); Jhy-Jyi Sze, Hsin-Chu (TW); Chien-Hsien Tseng, Hsinchu (TW); Kazuaki Hashimoto, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 125 days.

This patent is subject to a terminal disclaimer.

(21) Appl. No.: 17/315,185

(22) Filed: May 7, 2021

(65) Prior Publication Data
US 2021/0265414 A1    Aug. 26, 2021

Related U.S. Application Data

(63) Continuation of application No. 16/714,309, filed on Dec. 13, 2019, now Pat. No. 11,004,887, which is a continuation of application No. 16/101,211, filed on Aug. 10, 2018, now Pat. No. 10,510,797.

(Continued)

(51) Int. Cl.
   *H01L 27/146* (2006.01)

(52) U.S. Cl.
   CPC .... *H01L 27/14645* (2013.01); *H01L 27/1463* (2013.01); *H01L 27/1464* (2013.01);
   (Continued)

(58) Field of Classification Search
   CPC ........... H01L 27/1464; H01L 27/14621; H01L 27/14627; H01L 27/14629; H01L 27/1463; H01L 27/14636; H01L 27/14685
   See application file for complete search history.

(56) References Cited

U.S. PATENT DOCUMENTS

9,818,779 B2   11/2017   Tu et al.
9,837,455 B2   12/2017   Lin et al.
(Continued)

FOREIGN PATENT DOCUMENTS

CN    106992193 A    7/2017
TW    201537739 A    10/2015
(Continued)

OTHER PUBLICATIONS

Office Action, Cited References and Search Report dated Jul. 7, 2021 issued by the Taiwan Intellectual Property Office for the Corresponding Taiwanese Application No. 107138157.
(Continued)

*Primary Examiner* — Fernando L Toledo
*Assistant Examiner* — Neil R Prasad
(74) *Attorney, Agent, or Firm* — WPAT Law; Anthony King

(57) ABSTRACT

A BSI image sensor includes a substrate including a front side and a back side opposite to the front side, a pixel sensor disposed in the substrate, and a color filter disposed over the pixel sensor. The pixel sensor includes a plurality of first micro structures disposed over the back side of the substrate. The color filter includes a plurality of second micro structures disposed over the back side of the substrate. The first micro structures are arranged symmetrically to a first axial, and the second micro structures are arranged symmetrically to a second axial.

20 Claims, 11 Drawing Sheets

Related U.S. Application Data

(60) Provisional application No. 62/579,493, filed on Oct. 31, 2017.

(52) U.S. Cl.
CPC .. *H01L 27/14621* (2013.01); *H01L 27/14629* (2013.01); *H01L 27/14632* (2013.01); *H01L 27/14687* (2013.01); *H01L 27/14689* (2013.01)

(56) References Cited

U.S. PATENT DOCUMENTS

| | | | |
|---|---|---|---|
| 9,917,121 B2 | 3/2018 | Hsu et al. | |
| 10,510,797 B2 * | 12/2019 | Chiang | H01L 27/14689 |
| 10,910,504 B2 | 2/2021 | Yokogawa | |
| 11,004,887 B2 * | 5/2021 | Chiang | H01L 27/14632 |

FOREIGN PATENT DOCUMENTS

| | | |
|---|---|---|
| TW | 201727880 A | 8/2017 |
| TW | 201735334 A | 10/2017 |
| WO | 2017/098779 A1 | 6/2017 |

OTHER PUBLICATIONS

U.S. Pat. No. 10,910,504B2 Corresponds to WO2017/098779A1.
U.S. Pat. No. 9,837,455B2 Corresponds to CN106992193A.
U.S. Pat. No. 9,917,121B2 Corresponds to TW201735334A.
U.S. Pat. No. 9,818,779B2 Corresponds to TW201537739A.
U.S. Pat. No. 9,837,455B2 Corresponds to TW201727880A.

\* cited by examiner

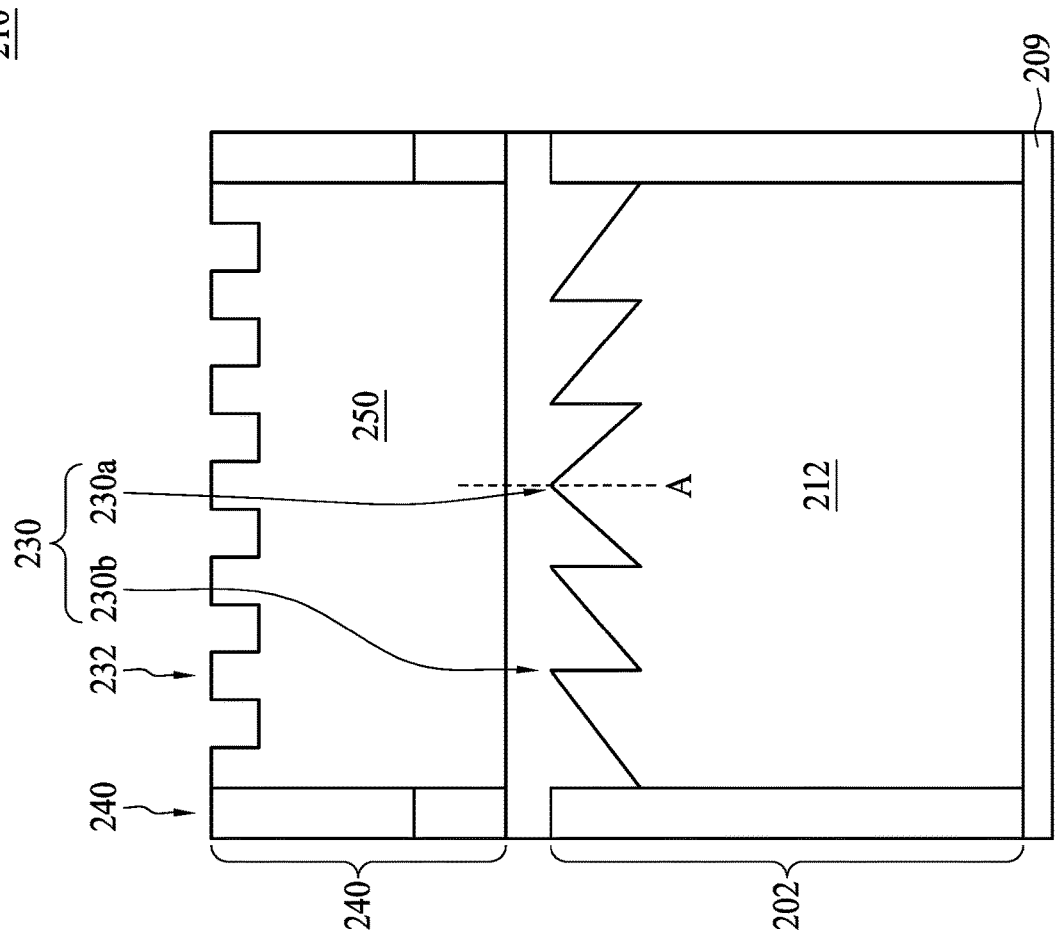

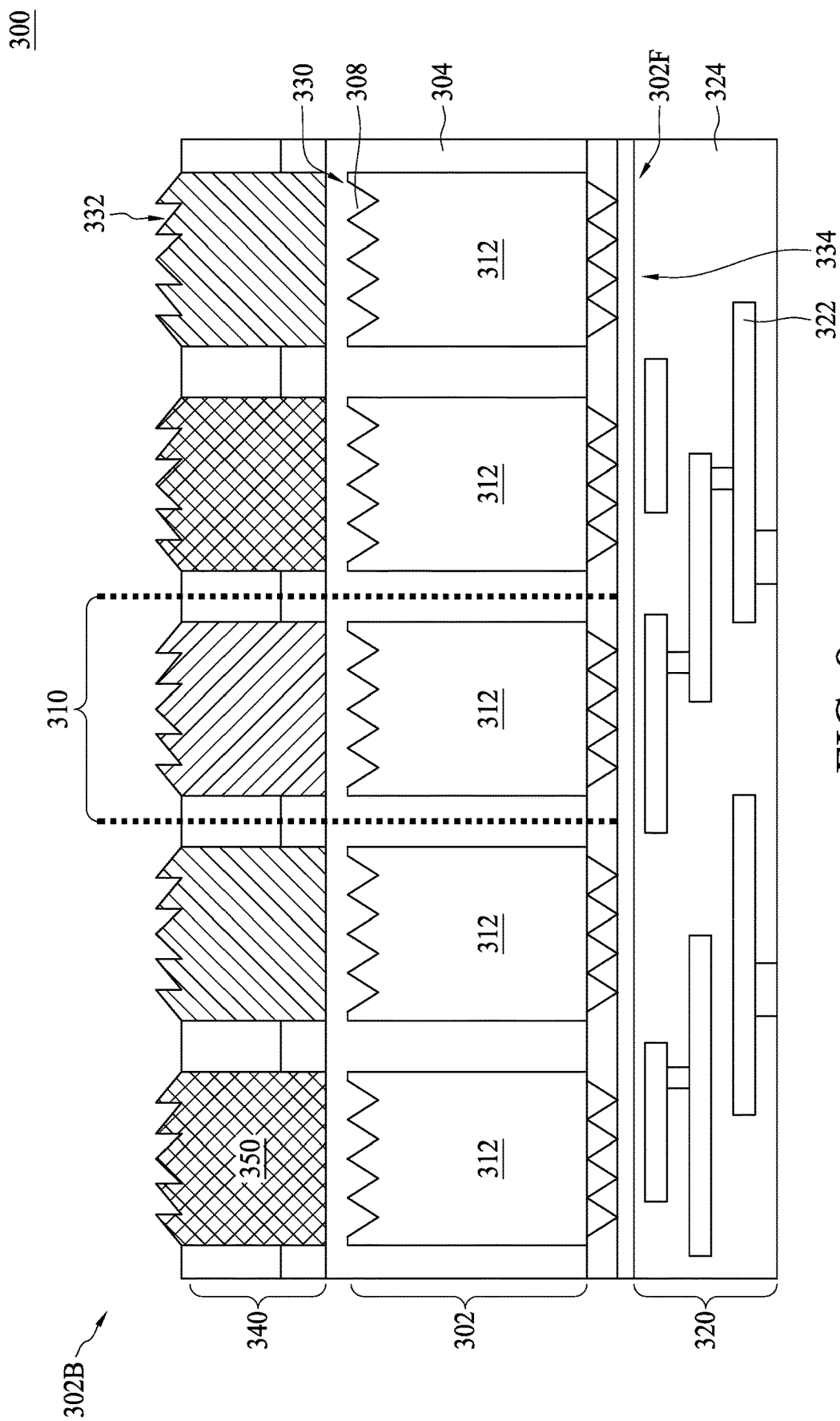

SEMICONDUCTOR IMAGE SENSOR

PRIORITY DATA

This application is a continuation of application Ser. No. 16/714,309, filed on Dec. 13, 2019, titled of "SEMICONDUCTOR IMAGE SENSOR", which is a continuation of application Ser. No. 16/101,211, filed on Aug. 10, 2018, which claims the benefit of U.S. Provisional Patent Application Ser. No. 62/579,493 filed Oct. 31, 2017, the entire disclosure of which is hereby incorporated by reference.

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 through FIG. 7 are partially enlarged view of BSI image sensors according to aspects of the present disclosure in some embodiments.

FIG. 8 is a sectional view of a BSI image sensor according to aspects of the present disclosure in one or more embodiments.

DETAILED DESCRIPTION

Figure 1A:
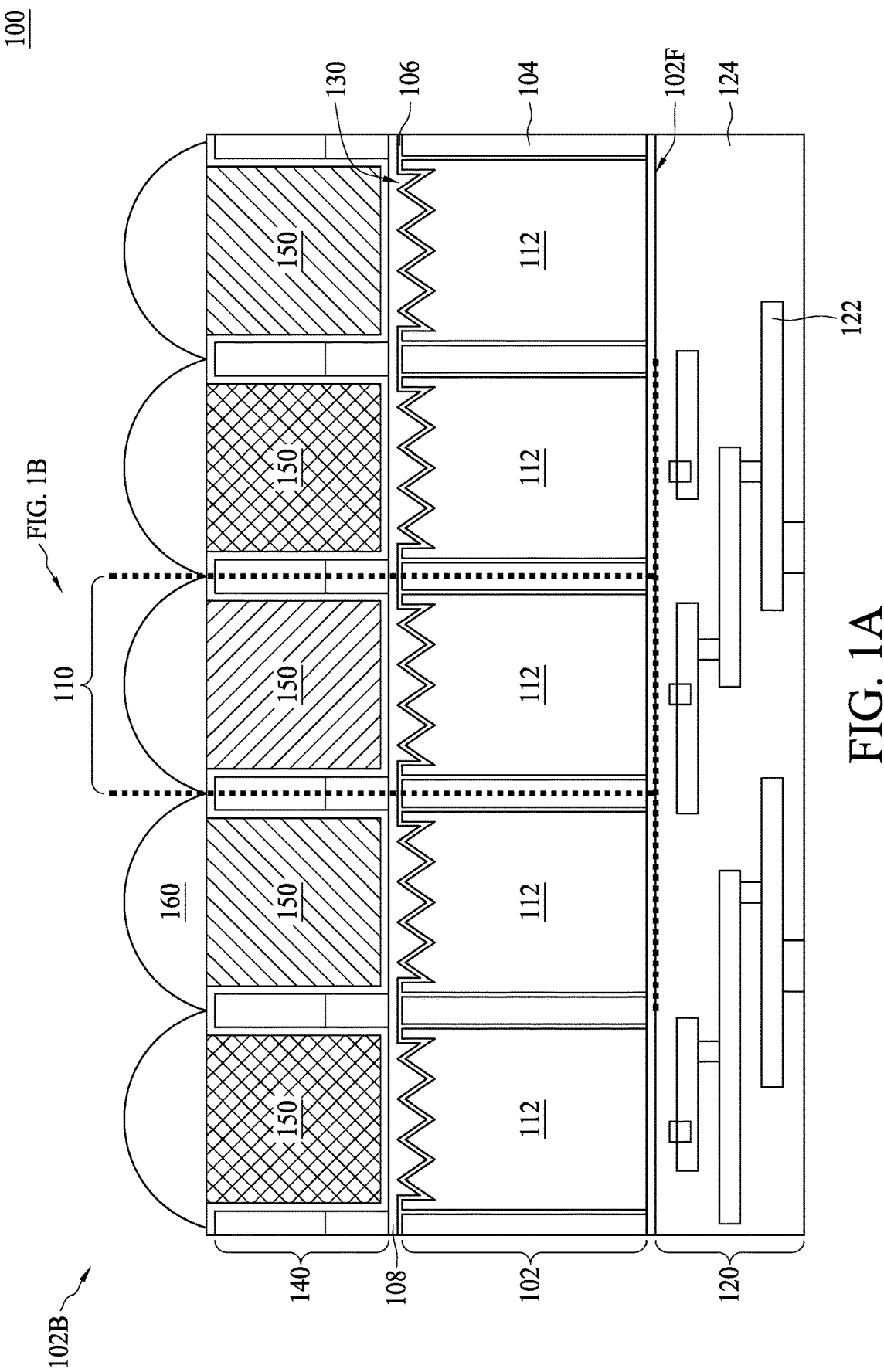
FIG. 1A is a sectional view of a BSI image sensor according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, "micro structures" refer to recessed or protruded structures that make an uneven or a rough surface of the substrate or the color filters. As used herein, a "recess" is a structure recessed from a perimeter or an edge of another structure, and a "protrusion" is a structure protruded from a perimeter or an edge of another structure.

BSI image sensor includes an array of pixel sensors. Typically, BSI image sensors include an integrated circuit having a semiconductor substrate and photodiodes corresponding to the pixel sensors arranged within the substrate, a back-end-of-line (BEOL) metallization of the integrated circuits disposed over a front side of the substrate, and an optical stack including color filters and micro-lens corresponding to the pixel sensors disposed over a back side of the substrate. As the size of BSI image sensors decrease, BSI image sensors face a number of challenges. One challenge with BSI image sensors is cross talk between neighboring pixel sensors, and another challenge with BSI image sensors is light collection. As BSI image sensors become smaller and smaller, the surface area for light collection becomes smaller and smaller, thereby reducing the sensitivity of pixel sensors. This is problematic for low light environments. Therefore, it is in need to increase absorption efficiency of the pixel sensors and angular response such that the sensitivity of BSI image sensors is improved.

The present disclosure therefore provides a BSI image sensor including a color filter with micro structures, thus the micro-lens can be removed and a height of the optical stack is reduced. More importantly, angular response is improved due to the height reduction. The present disclosure further provides a BSI image sensor including a thinner photodiode with micro structures disposed over a back side and/or front side, and longer light traveling distance is created in the photodiode due to the micro structures disposed over the back side. In other words, light is trapped in the thinner photodiode, and sensitivity of the pixel sensors is therefore improved.

Figure 1B:
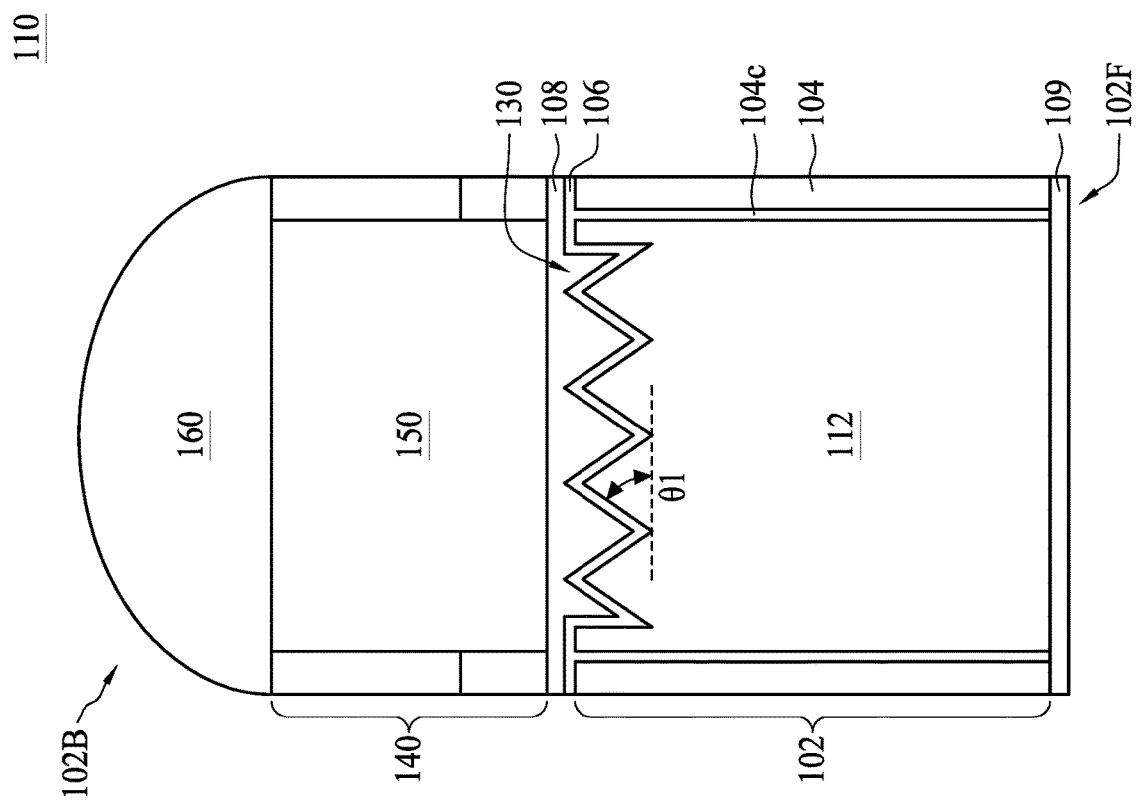
FIG. 1B is a partially enlarged view of the BSI image sensor of FIG. 1A.

FIG. 1A is a cross-sectional view of a BSI image sensor 100 according to aspects of the present disclosure in some embodiments and FIG. 1B is a partially enlarged view of a pixel sensor 110 of the BSI image sensor 100 of FIG. 1A. As shown in FIGS. 1A and 1B, the BSI image sensor 100 includes a substrate 102, and the substrate 102 includes, for example but not limited to, a bulk semiconductor substrate such as a bulk silicon (Si) substrate, or a silicon-on-insulator (SOI) substrate. The substrate 102 has a front side 102F and a back side 102B opposite to the front side 102F. The BSI image sensor 100 includes a plurality of pixel sensors 110 typically arranged within an array, each of the pixel sensors 110 includes a photo-sensing device, such as a photodiode 112 disposed in the substrate 102. In other words, the BSI image sensor 100 includes a plurality of photodiodes 112 corresponding to the pixel sensors 110. The photodiodes 112 are arranged in rows and columns in the substrate 102, and configured to accumulate charge (e.g. electrons) from photons incident thereon. Further, logic devices (not shown), such as transistors, are disposed over the substrate 102 on the front side 102F and configured to enable readout of the photodiodes 112.

A back-end-of-line (BEOL) metallization stack 120 is disposed on the front side 102F of the substrate 102. The BEOL metallization stack 120 includes a plurality of metallization layers 122 stacked in an interlayer dielectric (ILD) layer 124. One or more contacts of the BEOL metallization stack 120 is electrically connected to the logic devices. In some embodiments, the ILD layer 124 can include a low-k dielectric material (i.e., a dielectric material with a dielectric constant less than 3.9) or an oxide, but the disclosure is not limited to this. The plurality of metallization layers 122 may include a metal such as copper (Cu), tungsten (W), or aluminum (Al), but the disclosure is not limited to this. In some embodiments, another substrate (not shown) can be disposed between the metallization structure 120 and external connectors such as a ball grid array (BGA) (not shown). And the BSI image sensor 100 is electrically connected to other devices or circuits through the external connectors, but the disclosure is not limited to this.

A deep trench isolation (DTI) structure 104 is disposed in the substrate 102 as shown in FIGS. 1A and 1B. In some embodiments, the DTI structure 104 can be formed by the following operations. For example, a first etch is performed from the back side 102B of the substrate 102. The first etch results in a plurality of deep trenches (not shown) surrounding and between the photodiodes 112. An insulating material such as silicon oxide (SiO) is then formed to fill the deep trenches using any suitable deposition technique, such as chemical vapor deposition (CVD). In some embodiments, at least sidewalls of the deep trenches are lined by a coating 104c (labeled in FIG. 1B). The coating 104c may include a metal such W, Cu, or AlCu, or a low-n material, which has a refractive index (n) less than color filter formed hereafter. The low-n material can include SiO or hafnium oxide (HfM), but the disclosure is not limited to this. In some embodiments, the insulating material filling the deep trenches can include the low-n insulating material. A planarization is then performed to remove superfluous insulating material, thus the surface of the substrate 102 on the back side 102B is exposed, and the DTI structure 104 surrounding and between the photodiodes 112 is obtained as shown in FIGS. 1A and 1B. The DTI structure 104 provides optical isolation between neighboring pixel sensors 110 and photodiodes 112, thereby serving as a substrate isolation grid and reducing cross-talk.

In some embodiments, a plurality of color filters 150 corresponding to the pixel sensors 110 is disposed over the pixel sensors 110 on the back side 102B of the substrate 102. Further, a low-n structure 140 is disposed between the color filters 150 in some embodiments. In some embodiments, the low-n structure 140 includes a grid structure and the color filters 150 are located within the grid. Thus the low-n structure 140 surrounds each color filter 150, and separates the color filters 150 from each other as shown in FIGS. 1A and 1B. The low-n structure 140 can be a composite structure including layers with a refractive index less than the refractive index of the color filters 150. In some embodiments, the low-n structure 140 can include a composite stack including at least a metal layer and a dielectric layer disposed over the metal layer. In some embodiments, the metal layer can include W, Cu, or AlCu. The dielectric layer includes a material with a refractive index less than the refractive index of the color filter 150 or a material with a refractive index less than a refractive index of Si, but the disclosure is not limited to this. Due to the low refractive index, the low-n structure 140 serves as a light guide to direct or reflect light to the color filters 150. Consequently, the low-n structure 140 effectively increases the amount of the light incident into the color filters 150. Further, due to the low refractive index, the low-n structure 140 provides optical isolation between neighboring color filters 150.

Each of the color filters 150 is disposed over each of the corresponding photodiodes 112. The color filters 150 are assigned to corresponding colors or wavelengths of lights, and configured to filter out all but the assigned colors or wavelengths of lights. Typically, the color filters 150 assignments alternate between red, green, and blue lights, such that the color filters 150 include red color filters, green color filters and blue color filters. In some embodiments, the red color filters, the green color filters and the blue color filters are arranged in a Bayer mosaic pattern, but the disclosure is not limited to this.

In some embodiments, a plurality of micro-lenses 160 corresponding to the pixel sensors 110 is disposed over the color filters 150. It should be easily understood that locations and areas of each micro-lens 160 correspond to those of the color filter 150 as shown in FIGS. 1A and 1B.

Figure 5:
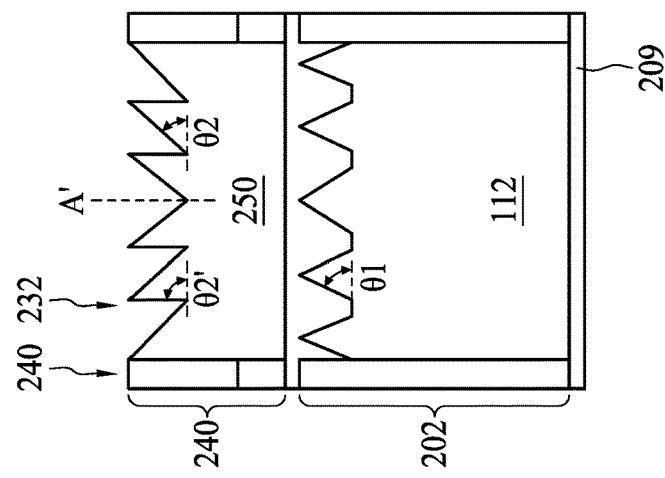
Figure 4:
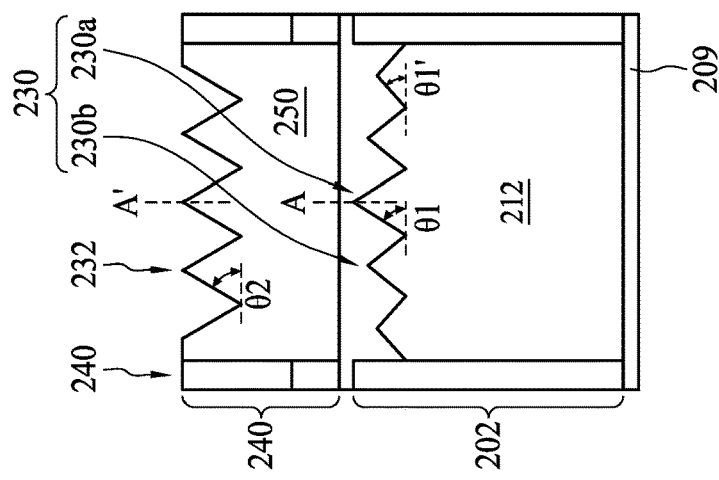
Figure 3:
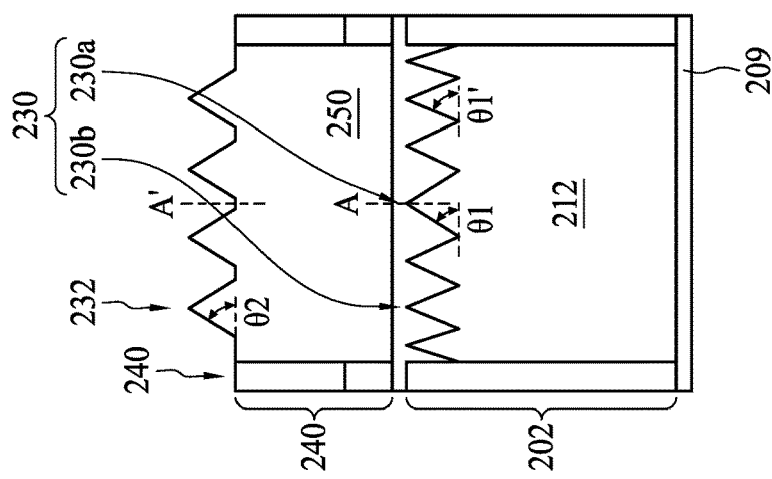
Figure 6:
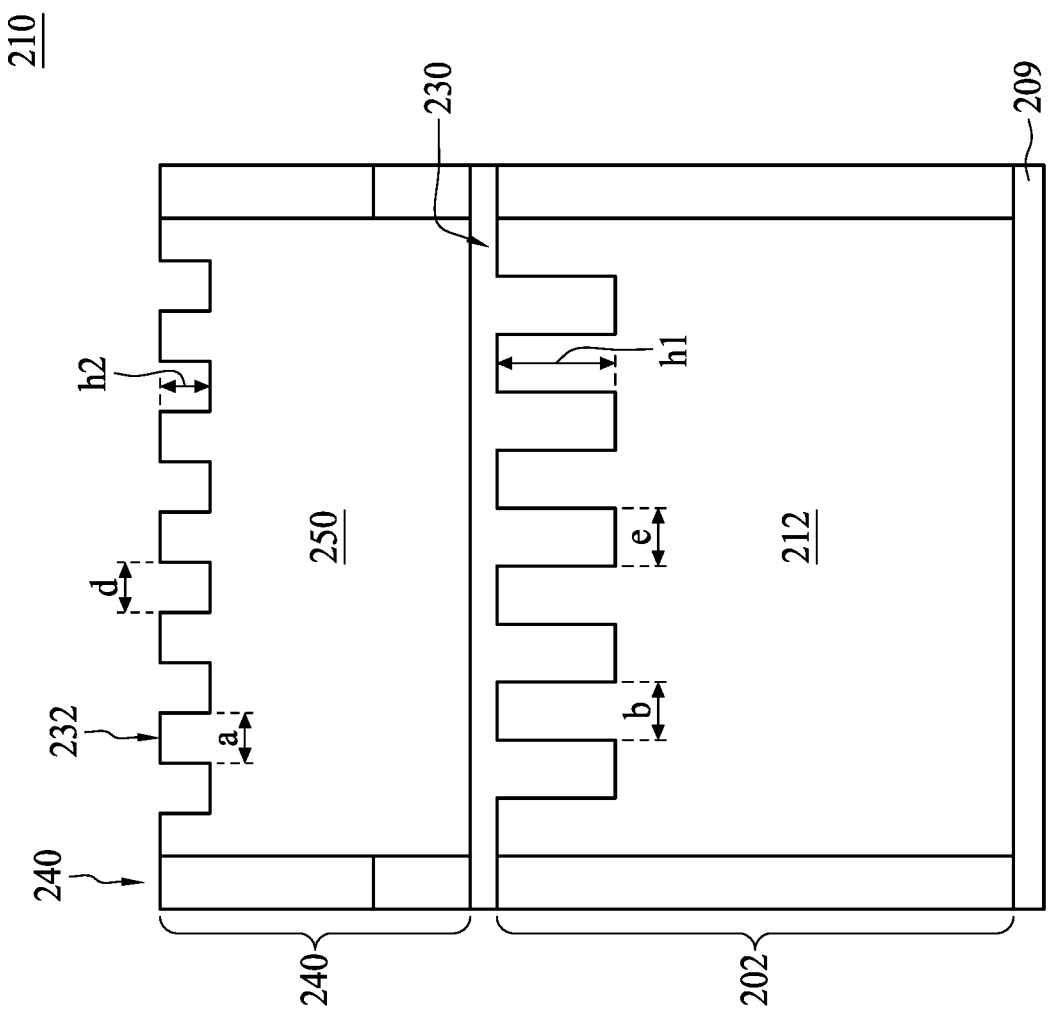

In some embodiments, each of the pixel sensors 110 includes a plurality of micro structures 130 disposed over the back side 102B of the substrate 102, as shown in FIGS. 1A and 1B. Further, the plurality of micro structures 130 are disposed over the photodiode 112 and surrounded by the DTI structure 104. The micro structures 130 and the photodiode 112 of one pixel sensor 110 are isolated from the micro structures 130 and the photodiode 112 of an adjacent pixel sensor 110 by the DTI structure 104, as shown in FIG. 1A. In some embodiments, the micro structures 130 can be formed by following operations. A mask layer (not shown) is disposed over the surface of the substrate 102 on the back side 102B, and followed by forming a patterned photoresist (not shown) over the mask layer. The substrate 102 is then etched through the patterned photoresist and the mask layer from the back side 102B, and thus the plurality of micro structures 130 is formed over the back side 102B of the substrate 102 within each of the pixel sensors 112. Then the patterned photoresist and the mask layer are removed. In some embodiments, further operations such as a wet etch, can be taken. As a result, upper and lower portions of the micro structures 130 are tapered or rounded to obtain a wave pattern as shown in FIGS. 1A and 1B. In some embodiments, a sidewall of micro structure 130 and a substrate-horizontal direction include at least an included angle θ1 (shown in FIG. 1B), and the included angle θ1 is related to a material of the micro structures 130. In some embodiments, the included angle θ1 is related to a refractive index of the micro structures 130. For example, when the refractive index of the micro structures 130 is about 3.6, the included angle θ1 is between about 48° and about 58°. The light will be tilted to about 40° after passing the micro structures 130. Further, the light angle becomes larger along with the refraction index gap between the micro structures 130 and a dielectric layer 108. In some embodiments, a height of the micro structures 130 is between about 0.2 micrometers (μm) and about 0.7 μm, and a width of the micros structures 130 is between about 0.3 μm and about 0.6 μm, but the disclosures is not limited to this. Further, by modifying the operations for forming the micro structures 130, various micros structures 130 can be obtained as shown in FIGS. 3 to 5. Further, in some embodiments, the micro structures 130 are spaced apart from each other (as shown in FIG. 6). Those various micro structures 130 will be further described in the following one or more embodiments.

In some embodiments, an anti-reflective coating (ARC) 106 and the dielectric layer 108 are disposed over the micro structures 130 at the back side 102B of the substrate 102. As shown in FIG. 1B, surfaces of the micro structures 130 are lined by the conformally formed ARC 106. The dielectric layer 108 fills spaces between the micro structures 130 and provides a substantially even surface over the back side 102B of the substrate 102. In some embodiments, the dielectric layer 108 can include, for example, an oxide such as silicon dioxide, but the disclosure is not limited to this. Additionally, another coating 109 corresponding to the pixel sensors 110 can be disposed over the front side 102F of the substrate 102 for light reflection in some embodiments.

Referring to FIG. 1B, the incident light is condensed to by the micro-lens 160 over each color filter 150 and then converged to the color filter 150. However, the incident light passing the color filter 150 is scattered or diffused by the micro structures 130 of the pixel sensor 110. Further, the direct incident light is dipped or tilted by the micro structures 130 when entering the photodiode 112, and thus longer light traveling distance is created in the photodiode 112. Further, light can be reflected back to the photodiode 112 by the coating 109 and the DTI structure 104. In other words, light is trapped in the photodiode 112, and sensitivity of the pixel sensor 110 is therefore improved. Additionally, since the light traveling distance is extended, a thickness of the photodiode 112 or the substrate 102 can be reduced and thus process is further simplified and improved.

Figure 2A:
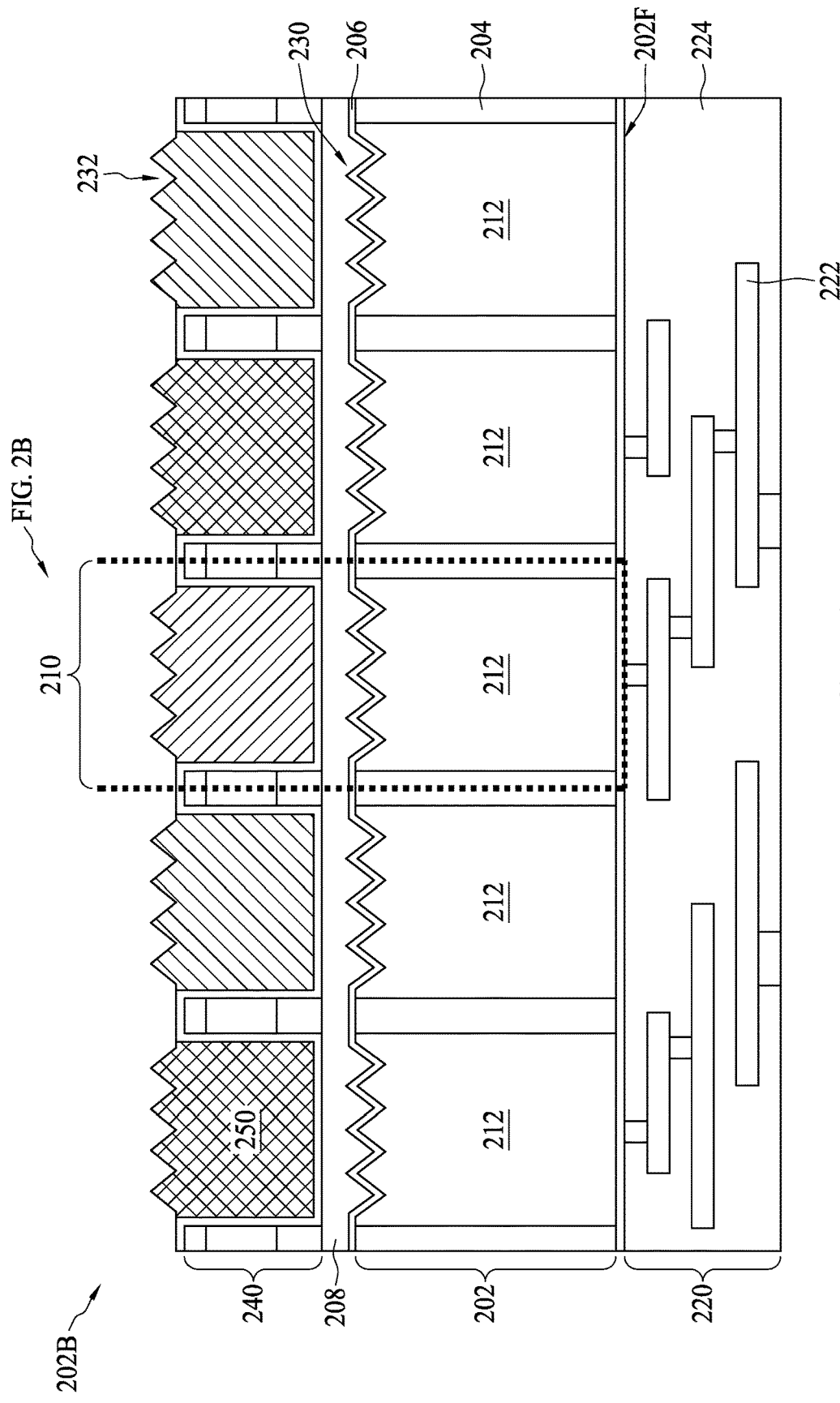
FIG. 2A is a sectional view of a BSI image sensor according to aspects of the present disclosure in one or more embodiments.
Figure 2B:
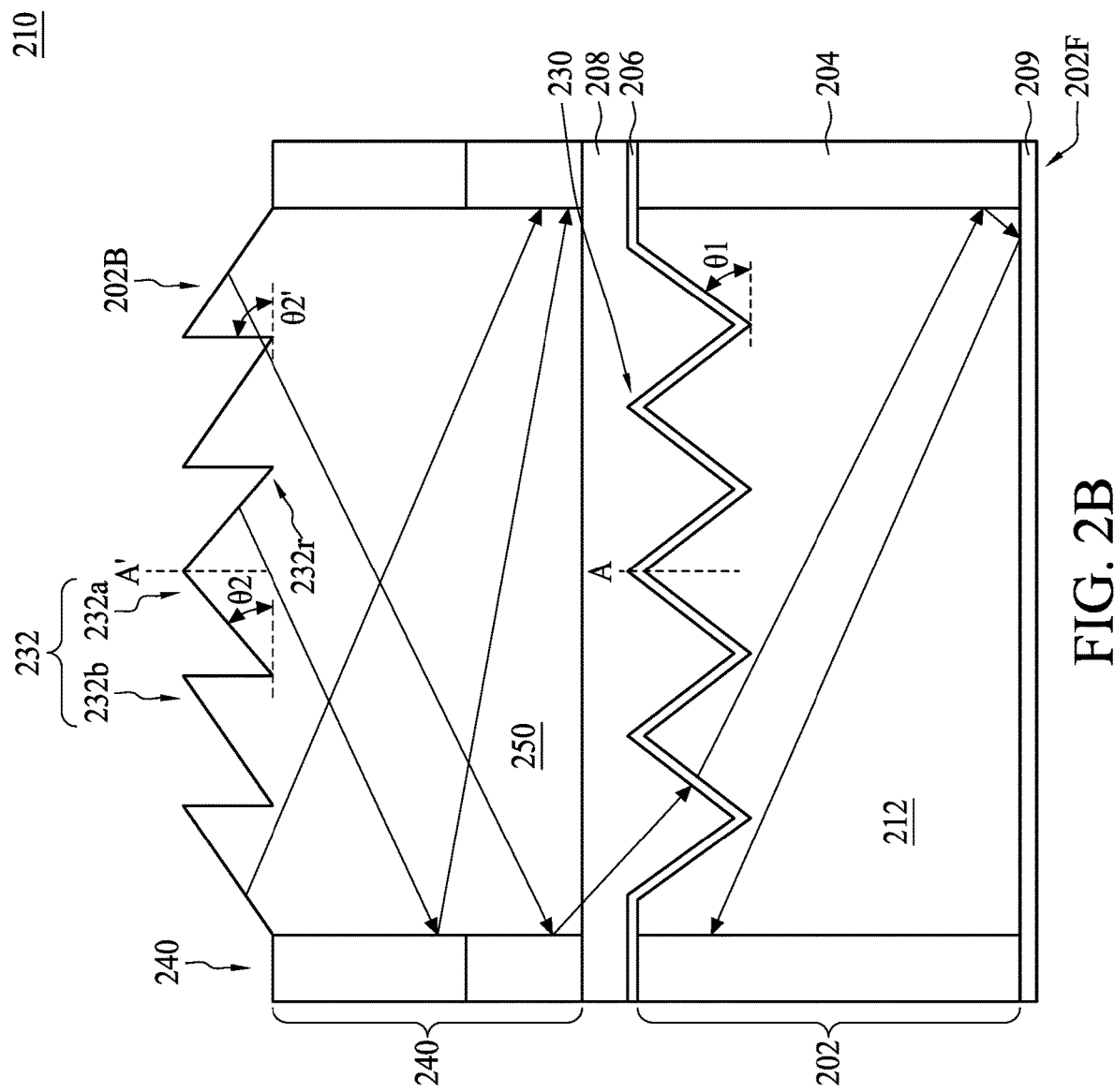
FIG. 2B is a partially enlarged view of the BSI image sensor of FIG. 2A.

FIG. 2A is a cross-sectional view of a BSI image sensor 200 according to aspects of the present disclosure in some embodiments and FIG. 2B is a partially enlarged view of a pixel sensor 210 of the BSI image sensor 200 of FIG. 2A. It should be noted that the same elements in the BSI image sensor 100 and the BSI image sensor 200 can include the same material and/or formed by the same operations, and thus those details are omitted in the interest of brevity. The BSI image sensor 200 includes a substrate 202, and the substrate 202 has a front side 202F and a back side 202B opposite to the front side 202F. The BSI image sensor 200 includes a plurality of pixel sensors 210 typically arranged within an army. A plurality of photo-sensing devices, such as photodiodes 212, corresponding to the pixel sensors 210 is disposed in the substrate 202. The photodiodes 212 are arranged in rows and columns in the substrate 202. Further, logic devices (not shown), such as transistors, are disposed over the front side 202F of the substrate 202 and configured to enable readout of the photodiodes 212.

A BEOL metallization stack 220 is disposed on the front side 202F of the substrate 202. As mentioned above, the BEOL metallization stack 220 includes a plurality of metallization layers 222 stacked in an ILD layer 224. One or more contacts of the BEOL metallization stack 220 is electrically connected to the logic devices. In some embodiments, another substrate (not shown) can be disposed between the metallization structure 220 and external connectors such as a ball grid array (BGA) (not shown). And the BSI image sensor 200 is electrically connected to other devices or circuits through the external connectors, but the disclosure is not limited to this. A DTI structure 204 is disposed in the substrate 202 as shown in FIGS. 2A and 2B. In some embodiments, the DTI structure 204 can include a low-n material, which has a refractive index less than color filter formed hereafter. In some embodiments, the DTI structure 204 can include an insulating material with a low-n coating sandwiched between the insulating material and the substrate 202. The DTI structure 204 surrounding and between the photodiodes 212 provides optical isolation between neighboring pixel sensors 210 and photodiodes 212, thereby serving as a substrate isolation grid and reducing cross-talk.

In some embodiments, a plurality of color filters 250 corresponding to the pixel sensors 210 is disposed over the pixel sensors 210 on the back side 202B of the substrate 202. Further, a low-n structure 240 is disposed between the color filters 250 in some embodiments. As mentioned above, the low-n structure 240 includes a grid structure and the color filters 250 are located within the grid. Thus the low-n structure 240 surrounds the color filters 250, and separates the color filters 250 from each other as shown in FIGS. 2A and 2B. The low-n structure 240 can be a composite structure including layers with a refractive index less than the refractive index of the color filters 250. Due to the low refractive index, the low-n structure 240 serves as a light guide to direct or reflect light to the color filters 250. Consequently, the low-n structure 240 effectively increases the amount of the light incident into the color filters 250. Further, due to the low refractive index, the low-n structure 240 provides optical isolation between neighboring color filters 250.

In some embodiments, each of the pixel sensors 210 includes a plurality of micro structures 230 disposed over the back side 202B. The micro structures 230 can be formed the operations mentioned above, and thus those details are omitted for brevity. As mentioned above, by modifying the operations for forming the micro structures 230, various types of micro structures 230 can be obtained. Those various micro structures 230 will be further described in the following one or more embodiments. In some embodiments, an ARC 206 and/or a dielectric layer 208 are disposed over the micro structures 230 at the back side 202B of the substrate 202. As shown in FIGS. 2A and 2B, surfaces of the micro structures 230 are lined by the conformally formed ARC 206. The dielectric layer 208 fills spaces between the micro structures 230 and provides a substantially even surface over the back side 202B of the substrate 202. Additionally, another coating 209 corresponding to the pixel sensors 210 can be disposed over the front side 202F of the substrate 202 for light reflection in some embodiments, as shown in FIG. 2B.

In some embodiments, each of the color filters 250 includes a plurality of micro structures 232 formed over the pixel sensor 210 on the back side 202B of the substrate 202. The color filters 250 are assigned to corresponding colors or wavelengths of lights, and configured to filter out all but the assigned colors or wavelengths of lights. In some embodiments, the operations for forming the color filters 250 and the micro structures 232 may include, for each of the different color of the color assignments, forming a color filter layer and patterning the color filter layer to obtain the color filter 250. After forming the color filters 250, a patterned photoresist (not shown) can be formed over the color filters 250. A treatment such as a thermal reflow can be performed such that the patterned photoresist is rounded or tapered. Subsequently, the color filters 250 is then etched through the rounded or tapered patterned photoresist to form the plurality of micro structures 232 in each of the color filters 250. In some embodiments, operations for forming the micro structures 232 may include forming a photosensitive material layer (not shown) over the color filters 250 and patterning the photosensitive material layer. In some embodiments, the photosensitive material layer and the color filter 250 can include the same material. However, in other embodiments, the photosensitive material layer and the color filter 250 can include different materials. A treatment such as a thermal reflow can be performed such that the patterned photosensitive material layer is rounded or tapered as shown in FIGS. 2A and 2B. Accordingly, the plurality of micro structures 232 is obtained. Further, by modifying those operations for forming the micro structures 232, various micro structures 232 can be formed, and the various micro structures 232 of each of the color filters 250 will be further described according to one or more embodiments.

FIGS. 3 to 7 are partially enlarged views of the BSI image sensor 200 according to one or more embodiments. As mentioned above, each of the pixel sensors 210 of the BSI image sensor 200 includes the plurality of micro structures 230 formed over the back side 202B of the substrate 202, and each of the color filters 250 includes the plurality of micro structures 232 formed over the back side 202B of the substrate 202. In some embodiments, the micro structures 230 include a wave pattern in the cross-sectional view as shown in FIGS. 2A to 5. In some embodiments, a sidewall of the micro structures 230 and a substrate-horizontal direction include at least the included angle θ1. As mentioned above, the included angle θ1 is related to a refractive index of the micro structures 230. For example, when the refractive index of the micro structures 230 is about 3.6, the included angle θ1 is between about 48° and about 58° as shown in FIGS. 2A to 5, but the disclosure is not limited to this. In some embodiments, the micro structures 230 can include at least one central portion 230a and a plurality of peripheral portions 230b, and a bottom width of the central portion 230a is greater than a bottom width of the peripheral portions 230b, while a height of the micro structures 230 are all the same, as shown in FIG. 3. Further, a sidewall of the central portion 230a and the substrate-horizontal direction include the include angle θ1, a sidewalls of the peripheral portion 230b and the substrate-horizontal direction include another include angle θ1', and the included angle θ1 is different from the included angle θ1' as shown in FIG. 3. In some embodiments, the micro structures 230 can include the at least one central portion 230a and the plurality of peripheral portions 230b, and the height of the central portion 230a is greater than the height of the peripheral portions 230b, while a bottom width of the micro structures 230 are all the same, as shown in FIG. 4. Further, a sidewall of the central portion 230a and the substrate-horizontal direction include the include angle θ1, a sidewalls of the peripheral portion 230b and the substrate-horizontal direction include another include angle θ1', and the included angle θ1 is different from the included angle θ1' as shown in FIG. 4. In some embodiments, the micro structures 230 are spaced apart from each other, as shown in FIG. 5. In other words, the micro structures 230 are discrete structures. Additionally, a flat surface can be disposed between the adjacent micro structures 230 as shown in FIG. 5, but the disclosure is not limited to this. Further, in some embodiments of the present disclosure, a top surface of the DTI structure 204 is between a bottom of the micro structures 230 and a bottom surface of the color filters 250, as shown in FIGS. 2A to 5.

Referring back to FIGS. 2A to 5, as mentioned above, each of the color filters 250 includes the plurality of micro structures 232 formed over the back side 202B of the substrate 202. In some embodiments, the micro structures 232 can include at least one central portion 232a and a plurality of peripheral portions 232b. The central portions 232a includes an isosceles triangle profile while the peripheral portions 232b include an non-isosceles triangle profile, such as a right angled triangle profile as shown in FIG. 2B, but the disclosures is not limited to this. And a bottom width of the central portion 232a is greater than a bottom width of the peripheral portions 232b. Further, at least a sidewall of the central portion 232a and the substrate-horizontal direction include an included angle θ2, related to a material of the color filters 250. In some embodiments, the included angle θ2 is related to a refractive index of the color filters 250. For example, when the refractive index of the color filters 250 is about 1.6, the included angle θ2 is between about 35° and about 55° as shown in FIG. 2B, but the disclosure is not limited to this. The light will be tilted to about 20° after passing the micro structure 232. Further, the light angle becomes larger along with the refraction index of the color filters 250. In some embodiments, a sidewall of the peripheral portion 232b and the substrate-horizontal direction include another included angle θ2', and the included angle 92' is different from the included angle θ2 as shown in FIG. 2B, but the disclosure is not limited to this. In some embodiments, all of the micro structures 232 include a same bottom width and an isosceles triangle profile, and a sidewall of the micro structures 232 and the substrate-horizontal direction include the included angle θ2, as shown in FIGS. 3 and 4. In some embodiments, a top surface of the low-n structure 240 is between a topmost portion of the micro structure 232 and a bottom surface of the color filter as shown in FIG. 3. In some embodiments, topmost portion of the micro structure 232 of each of the color filters 250 is coplanar with a top surface of the low-n structure 240, and a lowest portion of the micro structure 232 is between the top surface of the low-n structure 240 and the bottom surface of the color filter as shown in FIGS. 4 and 5. In some embodiments, sidewalls of the micro structures 232 and the substrate-horizontal direction include two different include angle θ2 and 02', and at least the included angle θ2 is between about 35° and about 55° as shown in FIG. 5, but the disclosures is not limited to this.

In some embodiments, the micro structures 230 can be arranged symmetrically to an axial A, as shown in FIGS. 3-5, but the disclosures is not limited to this. In some embodiments, the micro structures 232 can be arranged symmetrically to an axial A', as shown in FIGS. 3-5, but the disclosures is not limited to this. It should be understood that the arrangements for the micro structures 230 and the micro structure 232 are independent.

As mentioned above, by modifying operations for forming the micro structures 230 and the micro structures 232, various types of micro structures 230 and the micro structures 232 can be obtained. For example in some embodiments, rounding or tapering operation is not performed. Thus the micro structures 230 are spaced apart from each other as shown in FIG. 6. In other words, the micro structures 230 are discrete structures. In some embodiments, a width "b" of the micro structures 230 is between about 0.3 μm and about 0.6 μm, a spacing width "e" between the micro structures 230 is between about 0.3 μm and about 0.6 μm, and a height "h1" of the micro structures 230 is between about 0.2 μm and about 0.7 μm, but the disclosure is not limited to this. Still referring to FIG. 6, in some embodiments, the operation for forming the micro structures 232 is modified. For example, the thermal reflow operation is not performed, such that the micro structures 232 are spaced apart from each other as shown in FIG. 6. In other words, the micro structures 232 are discrete structures. In some embodiments, a width "a" of the micro structures 232 is between about 0.3 μm and about 0.6 μm, a spacing width "d" between the micro structures 232 is between about 0.3 μm and about 0.6 μm, and a height "h2" of the micro structures 230 is between about 0.2 μm and about 0.6 μm, but the disclosure is not limited to this. In some embodiments, the height h2 of the micro structure 232 is less than the height h1 of the micro structure 230, but the disclosure is not limited to this.

Please refer to FIG. 7. It should be noted that the various micro structure 230 and the various micro structure 232 are formed independently. Therefore, the various micro structures 230 and the various micro structures 232 can have any combination. For example, in some embodiments, the pixel sensor 210 can include the continuous or joined micro structures 230 and the color filter 250 can include the continuous or joined micro structures 232 as shown in FIGS. 2A to 5. In some embodiments, the pixel sensor 210 can include the discrete micro structures 230 and the color filter 250 can include the discrete micro structures 232 as shown in FIG. 6. Still in some embodiments, the pixel sensor 212 can include the continuous or joined micro structures 230 while the color filter 250 can include the discrete micro structures 232 as shown in FIG. 7, or vice versa.

Referring back to FIG. 2B, due to the micro structures 232 of the color filter 250, the light entering the color filter 250 is diffused, and thus longer light traveling distance is obtained. More importantly, micro-lens is no longer required in the BSI image sensor 200 because the color filter 250 including the micro structures 232 serves as a color-lens. Consequently, a height of the optical stack is reduced, and angle response is improved. Still referring to FIG. 2B, due to the micro structures 232 of the color filter 250 and the micro structures 230 of the pixel sensor 210, the light is diffused in the color filter 250 and the photodiode 212. Further, the direct incident light is dipped or tilted by the micro structure 230 and 232 when entering the photodiode 212, and thus longer light traveling distance is obtained. Consequently, absorption of the photodiode 212 is increased. Further, since the light can be reflected back to the photodiode 212 by the DTI structure 204 and the coating 209, it is taken that light is trapped within the photodiode 212 as shown in FIG. 2B. Accordingly, more photons are absorbed, and the sensitivity of the BSI image sensor 200 is improved. Additionally, since the light traveling distance is extended, a thickness of the photodiode 212 or the substrate 202 can be reduced and thus process is further simplified and improved.

With reference to FIG. 8, a cross-sectional view of a BSI image sensor 300 according to aspects of the present disclosure in some embodiments is provided. It should be noted that the same elements in the BSI image sensor 100/200 and the BSI image sensor 300 can include the same material and/or formed by the same operations, and thus those details are omitted in the interest of brevity. The BSI image sensor 300 includes a substrate 302, and the substrate 302 has a front side 302F and a back side 302B opposite to the front side 302F. The BSI image sensor 300 includes a plurality of pixel sensors 310 typically arranged within an array. A plurality of photodiode 312 corresponding to the pixel sensor 310 is disposed in the substrate 302. Further, logic devices (not shown), such as transistors, are disposed over the front side 302F of the substrate 302 and configured to enable readout of the photodiodes 312.

A BEOL metallization stack 320 is disposed on the front side 302F of the substrate 302. As mentioned above, the BEOL metallization stack 320 includes a plurality of metallization layers 322 stacked in an ILD layer 324. One or more contacts of the BEOL metallization stack 320 is electrically connected to the logic devices. In some embodiments, another substrate (not shown) can be disposed between the metallization structure 320 and external connectors such as a ball grid array (BGA) (not shown). And the BSI image sensor 300 is electrically connected to other devices or circuits through the external connectors, but the disclosure is not limited to this. A DTI structure 304 is disposed in the substrate 302 as shown in FIG. 8. In some embodiments, the DTI structure 304 can include a low-n material, which has a refractive index less than color filter formed hereafter. In some embodiments, the DTI structure 304 can include an insulating material with a low-n coating sandwiched between the insulating material and the substrate 302. The DTI structure 304 surrounding and between the photodiodes 306 provides optical isolation between neighboring pixel sensors 310 and photodiodes 312, thereby serving as a substrate isolation grid and reducing cross-talk.

In some embodiments, each of the pixel sensors 310 includes a plurality of micro structures 330 formed over the back side 302B of the substrate 302 and a plurality of micro structures 334 over the front side 302F as shown in FIG. 8. In some embodiments, an ARC 306 and a dielectric layer 308 are disposed over the micro structures 330 on the back side 302B of the substrate 302. As mentioned above, surfaces of the micro structures 330 can be lined by the conformally formed ARC 306. The dielectric layer 308 fills spaces between the micro structures 330 and provides a substantially even surface over the back side 302B of the substrate 302. In some embodiments, a dielectric layer 307 and an ARC 309 are disposed over the micro structures 334 on the front side 302F of the substrate 302 as shown in FIG. 8. The dielectric layer 309 fills spaces between the micro structures 334 and provides a substantially even surface over the front side 302F of the substrate 302. And the ARC 309 is formed over the even surface for improving light reflection. The micro structures 330 and the micro structure 334 of each of the pixel sensors 310 will be further described according to one or more embodiments.

In some embodiments, a plurality of color filters 350 corresponding to the pixel sensors 310 is disposed over the pixel sensors 310 on the back side 302B of the substrate 302. Further, a low-n structure 340 is disposed between the color filters 350 in some embodiments. As mentioned above, the low-n structure 340 includes a grid structure and the color filters 350 are located within the grid. Thus the low-n structure 340 surrounds the color filters 350, and separates the color filters 350 from each other as shown in FIG. 8. The low-n structure 340 can be a composite structure including layers with a refractive index less than the refractive index of the color filters 350. Due to the low refractive index, the low-n structure 340 serves as a light guide to direct or reflect light to the color filters 350. Consequently, the low-n structure 340 effectively increases the amount of the light incident into the color filters 350. Further, due to the low refractive index, the low-n structure 340 provides optical isolation between neighboring color filters 350.

The color filters 350 are assigned corresponding colors or wavelengths of lights, and configured to filter out all but the assigned colors or wavelengths of lights. More importantly, each of the color filters 350 includes a plurality of micro structures 332 as shown in FIG. 8. As mentioned above, by modifying operations for forming the micro structures 332, various types of the micro structures 332 will be obtained. The various micro structures 332 of each of the color filters 350 will be further described according to one or more embodiments.

Figure 10:
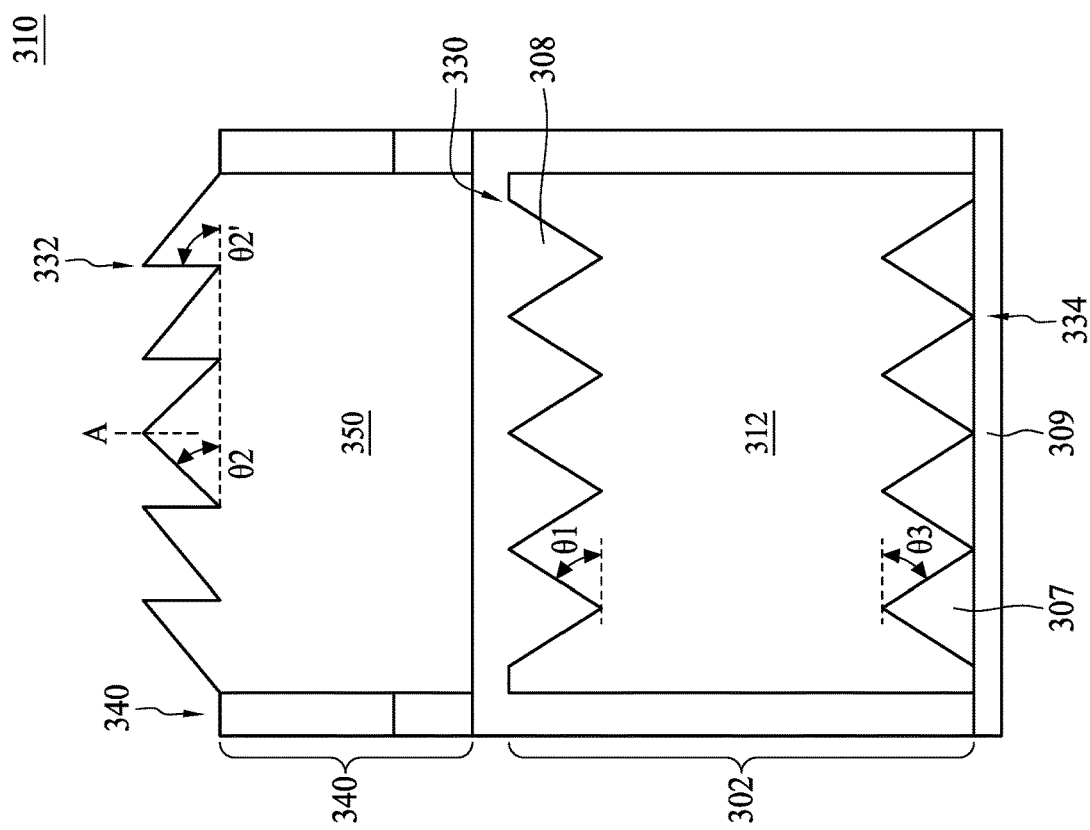
FIG. 9 through FIG. 12 are partially enlarged view of BSI image sensors according to aspects of the present disclosure in some embodiments.
Figure 9:
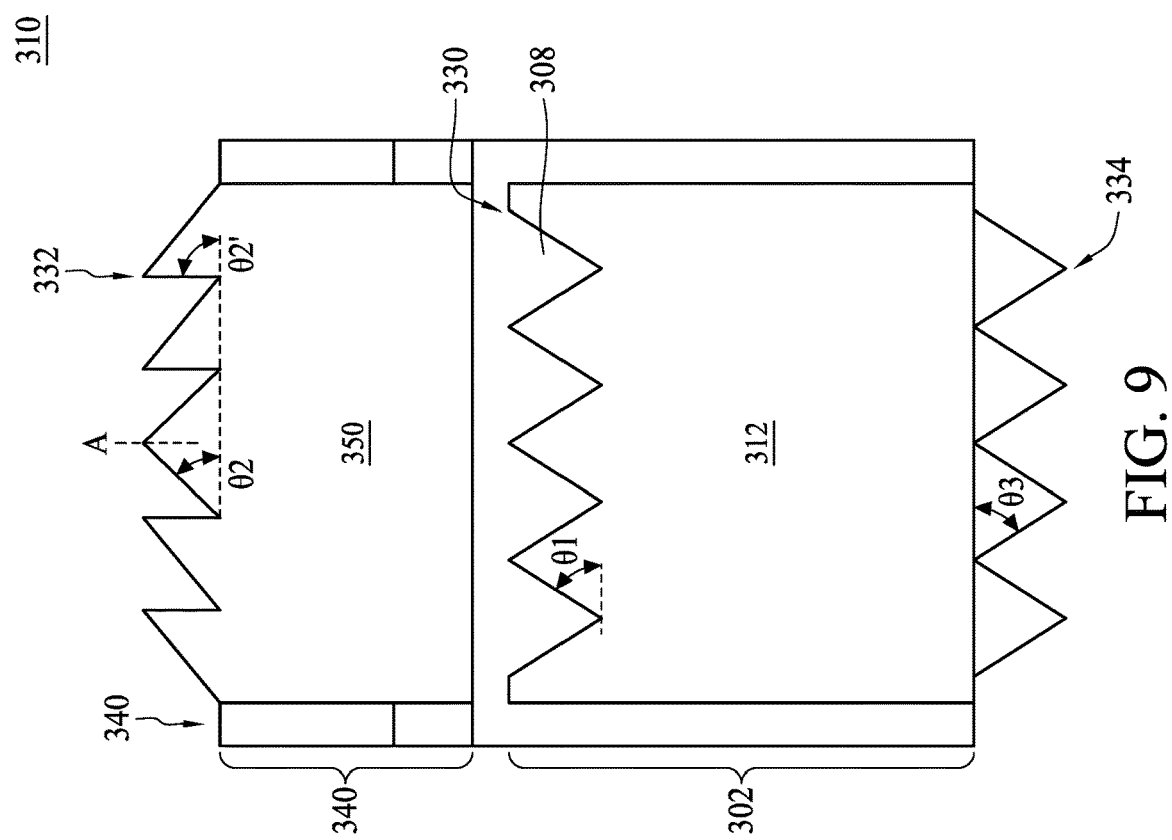

FIGS. 9 to 10 are partially enlarged views of the BSI image sensor 300 according to one or more embodiments. As mentioned above, each of the pixel sensors 310 of the BSI image sensor 300 includes the plurality of micro structures 330 formed over the back side 302B of the substrate 302. In some embodiments, the micro structures 330 include a wave pattern in the cross-sectional view as shown in FIGS. 9-10. In some embodiments, a sidewall of the micro structures 330 and a substrate-horizontal direction include at least an included angle θ1. As mentioned above, the included angle θ1 is related to a refractive index of the micro structures 330. For example, when the refractive index of the micro structures 330 is about 3.6, the included angle θ1 is between about 48° and about 58° as shown in FIGS. 9 to 10, but the disclosure is not limited to this. As mentioned above, the light will be tilted to about 40° after passing the micro structures 330. Further, the light angle becomes larger along with the refraction index gap between the micro structures 330 and the dielectric layer 308. In some embodiments, the micro structures 330 can include the wave pattern in the cross-sectional view as shown in FIGS. 3 to 5, and those details are omitted for simplicity.

As mentioned above, each of the pixel sensors 310 of the BSI image sensor 300 includes the plurality of micro structures 334 formed over the front side 302F of the substrate 302. In some embodiments, the micro structures 334 can be formed by operations similar with those for forming the micro structures 330, therefore those details are omitted for brevity. By modifying the operations for forming the micro structures 334, various types of micro structures 334 can be obtained. In some embodiments, the micro structures 334 include a wave pattern in the cross-sectional view as shown in FIGS. 9 to 10. In some embodiments, a sidewall of the micro structures 334 and a substrate-horizontal direction include at least an included angle θ3. The included angle θ3 is related to a refractive index of the micro structures 334. For example, when the refractive index of the micro structures 334 is about 3.6, the included angle θ3 is between about 48° and about 58° as shown in FIGS. 9 to 10, but the disclosure is not limited to this.

As mentioned above, each of the color filters 350 includes the plurality of micro structures 332 formed over the pixel sensor 310 on the back side 302B of the substrate 302. In some embodiments, the micro structures 332 can be formed by operations as mentioned above, and thus details are omitted in the interest of brevity. By modifying the operations for forming the micro structures 332, various types of micro structures 332 can be obtained as shown in FIGS. 9 to 10. In some embodiments, the micro structures 332 include a wave pattern in the cross-sectional view as shown in FIGS. 9-10. Further, at least a sidewall of one of the micro structures 332 and the substrate-horizontal direction include an included angle θ2. As mentioned above, the included angle θ2 is related to a refractive index of the color filters 350. For example, when the refractive index of the color filters 350 is about 1.6, the included angle θ2 is between about 35° and about 55° as shown in FIG. 9, but the disclosure is not limited to this. As mentioned above, the light will be tilted to about 20° after passing the micro structure 332. Further, the light angle becomes larger along with the refraction index of the color filters 350. As mentioned above, in some embodiments, a top surface of the low-n structure 340 is between a topmost portion of the micro structure 332 and a bottom surface of the color filter as shown in FIG. 9. In some embodiments, sidewalls of the micro structures 332 and the substrate-horizontal direction include two different include angle θ2 and θ2', and at least the included angle θ2 is between about 35° and about 55° as shown in FIGS. 9 to 10, but the disclosures is not limited to this. In some embodiments, the micro structures 332 can include the wave pattern in the cross-sectional view as shown in FIGS. 3 to 5, and those details are omitted for simplicity.

Figure 11:
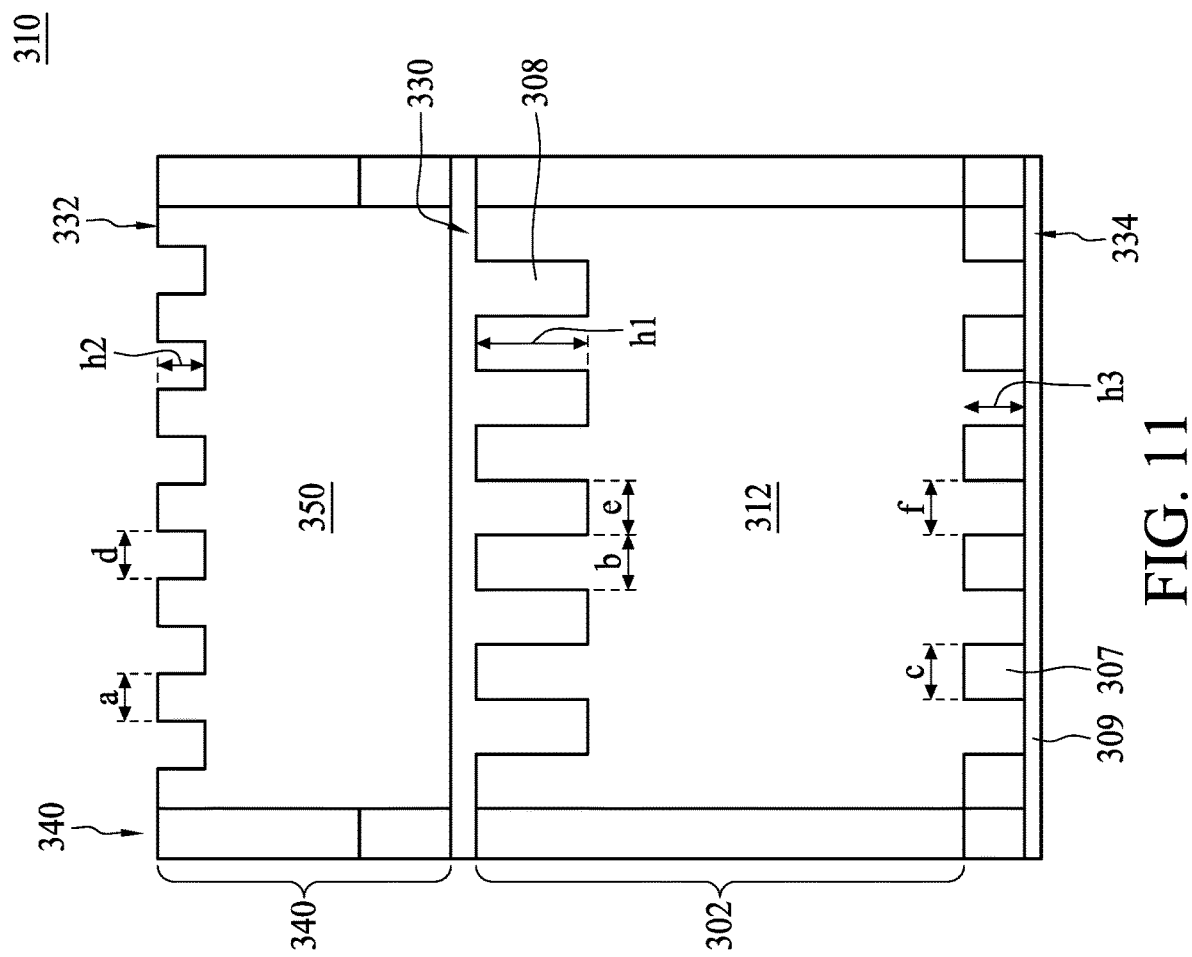

Referring to FIG. 11, in some embodiments, the operation for forming the micro structures 330 can be modified. For example, the rounding or tapering operation is not performed such that the micro structures 330 are spaced apart from each other. In other words, the micro structures 330 are discrete structures as shown in FIG. 11. In some embodiments, a width "b" of the micro structures 330 is between about 0.3 μm and about 0.6 μm, a spacing width "e" between the micro structures 330 is between about 0.3 μm and about 0.6 μm, and a height "h1" of the micro structures 330 is between about 0.2 μm and about 0.7 μm, but the disclosure is not limited to this. Further, in some embodiments of the present disclosure, a top surface of the DTI structure 304 is between a bottom of the micro structures 330 and a bottom surface of the color filters 350, as shown in FIG. 11.

Referring to FIG. 11, in some embodiments, the operation for forming the micro structures 334 can be modified. For example, the rounding or tapering operation is not performed such that the micro structures 334 are spaced apart from each other. In other words, the micro structures 334 are discrete structures. In some embodiments, a spacing width "c" of between the micro structures 334 is between about 0.2 μm and about 0.6 μm, and a width "f" of the micro structures 334 is between about 0.2 μm and about 0.6 μm. The height h1 of the micro structures 330 is greater than a height "h3" of the micro structures 334. In some embodiments, the height h3 of the micro structures 334 is between about 0.05 μm and about 0.2 μm, but the disclosure is not limited to this.

Still referring to FIG. 11, in some embodiments, the operation for forming the micro structures 332 is modified. For example, the thermal reflow operation is not performed such that the micro structures 332 are spaced apart from each other as shown in FIG. 11. In other words, the micro structures 332 are discrete structures. In some embodiments, a width "a" of the micro structures 332 is between about 0.3 μm and about 0.6 μm, a spacing width "d" between the micro structures 332 is between about 0.3 μm and about 0.6 μm, and a height "h2" of the micro structures 332 is between about 0.2 μm and about 0.6 μm, but the disclosure is not limited to this. In some embodiments, the height h2 of the micro structure 332 is less than the height h1 of the micro structure 330, but the disclosure is not limited to this.

Figure 12:
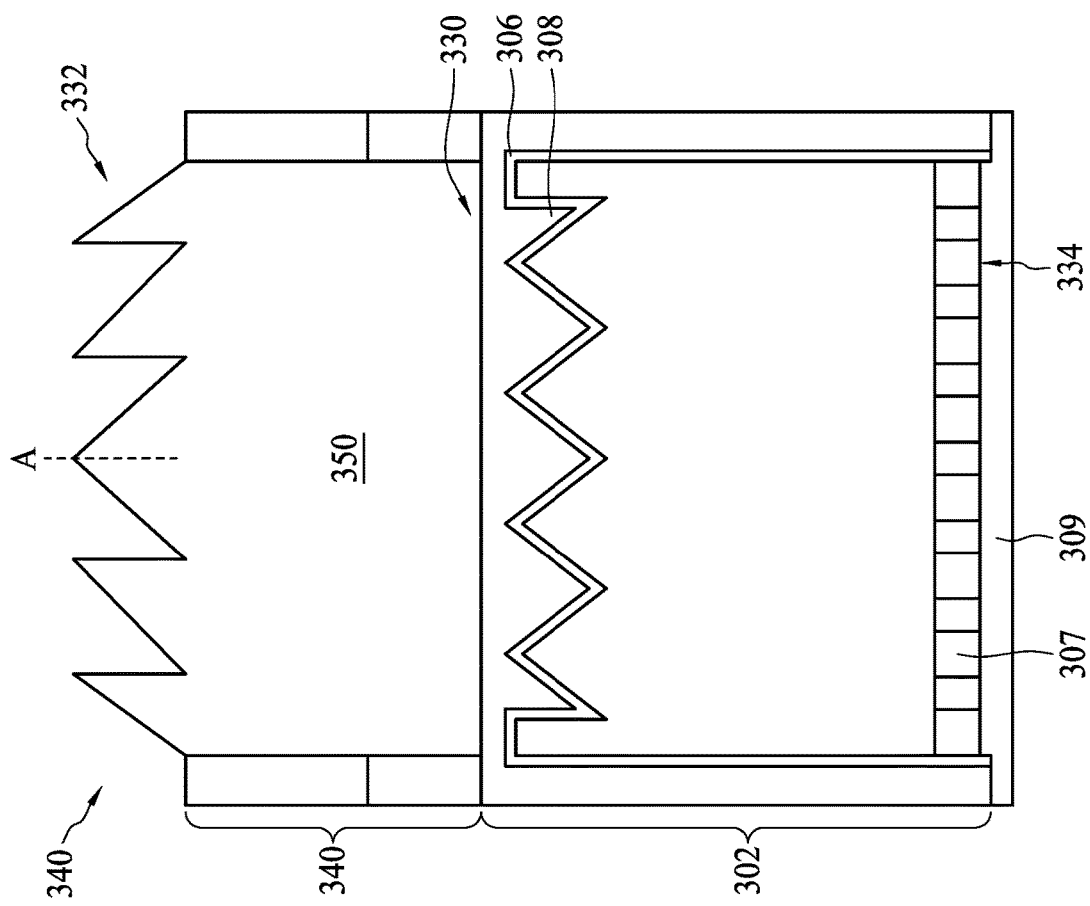

It should be noted that the various micro structures 330, the various micro structures 332 and the various micro structures 334 can be formed independently. Therefore, the various micro structures 330, the various micro structures 332 and the various micro structures 334 can have any combination. For example, in some embodiments, the pixel sensor 310 can include the continuous or joined micro structures 330 and 334, and the color filter 350 can include the continuous or joined micro structures 332 as shown in FIGS. 8 to 10. In some embodiments, the pixel sensor 310 can include the discrete micro structures 330 and 334, and the color filter 350 can include the discrete micro structures 332 as shown in FIG. 11. Still in some embodiments, the pixel sensor 312 can include the continuous or joined micro structures 330 over the back side 302B and the color filters 350 can include the continuous or joined micro structures 332 while the micro structures 334 over the front side 302F of the substrate 302 are discrete structures as shown in FIG. 12, but the disclosure is not limited to this.

Referring back to FIG. 8, due to the micro structures 332 of the color filter 350, the light entering the color filter 350 is diffused, and thus longer light traveling distance is obtained. More importantly, micro-lens is no longer required in the BSI image sensor 300 because the color filter 350 including the micro structures 332 serves as a color-lens. Consequently, a height of the optical stack is reduced, and angle response is improved. Still referring to FIG. 8, due to the micro structures 332 of the color filter 350 and the micro structures 330 of the pixel sensor 310, the light is diffused in the color filter 350 and the photodiode 312. Further, the incident lights are dipped or tilted by the micro structures 330 and the micro structures 332 when entering the photodiode 312, and thus longer light traveling distance is obtained. Consequently, absorption of the photodiode 312 is increased. Moreover, the micro structures 334 formed over the front side 302F of the substrate 302 improves light reflection to the photodiode 312 while the light can also be reflected back to the photodiode 312 by the DTI structure 304, a resonant cavity is thus created and light is trapped within the photodiode 312. Accordingly, more photons are absorbed, and the sensitivity of the BSI image sensor 300 is improved. Additionally, since the light traveling distance is extended, a thickness of the photodiode 312 or the substrate 302 can be reduced and thus process is further simplified and improved.

In the present disclosure, a BSI image sensor including a color filter with micro structures is provided, thus the micro-lens can be removed and a height of the optical stack is reduced. More importantly, angular response is improved due to the height reduction. The present disclosure further provides a BSI image sensor including a thinner photodiode with micro structures disposed over a front side and/or back side, thus longer light traveling distance in the photodiode is created and light can be reflected back to the photodiode. In other words, light is trapped in the thinner photodiode, and sensitivity of the pixel sensor is improved accordingly.

In some embodiments, a BSI image sensor is provided. The BSI image sensor includes a substrate including a front side and a back side opposite to the front side, a pixel sensor disposed in the substrate, and a color filter disposed over the pixel sensor. The pixel sensor includes a plurality of first micro structures disposed over the back side of the substrate. The color filter includes a plurality of second micro structures disposed over the back side of the substrate. The first micro structures are arranged symmetrically to a first axial, and the second micro structures are arranged symmetrically to a second axial.

In some embodiments, a BSI image sensor is provided. The BSI image sensor includes a substrate including a front side and a back side opposite to the front side, a pixel sensor disposed in the substrate, and a color filter disposed over the pixel sensor. The pixel sensor includes a plurality of first micro structure disposed over the back side of the substrate. The color filter includes a plurality of second micro structures disposed over the back side of the substrate. Each of the first micro structures is different from each of the second micro structures.

In some embodiments, a BSI image sensor is provided. The BSI image sensor includes a substrate including a front side and a back side opposite to the front side, a photodiode disposed in the substrate, a color filter disposed over the back side of the substrate, a plurality of first micro structures disposed between the photodiode and the color filter, a plurality of second micro structures disposed over the front side of the substrate, and a dielectric layer disposed between adjacent second micro structures. A surface of the dielectric layer and surfaces of the second micro structures form a flat surface over the front side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illumination (BSI) image sensor comprising:
    a substrate comprising a front side and a back side opposite to the front side;
    a pixel sensor disposed in the substrate; and the pixel sensor comprising a plurality of first micro structures disposed over the back side of the substrate; and
    a color filter disposed over the pixel sensor, and the color filter comprising a plurality of second micro structures disposed over the back side of the substrate,
    wherein the first micro structures are arranged symmetrically to a first axial, and the second micro structures are arranged symmetrically to a second axial.

2. The BSI image sensor of claim 1, wherein the first axial and the second axial are aligned with each other.

3. The BSI image sensor of claim 1, wherein a sidewall of at least one of the first micro structures and a substrate-horizontal direction comprise at least a first included angle, and a sidewall of at least one of the second micro structures and the substrate-horizontal direction comprise at least a second included angle.

4. The BSI image sensor of claim 3, wherein the first included angle and the second included angle are different from each other.

5. The BSI image sensor of claim 3, wherein the first included angle and the second included angle are the same.

6. The BSI image sensor of claim 3, wherein a sidewall of another one of the first micro structures and the substrate-horizontal direction comprise a third included angle, and the third included angle is different from the first included angle.

7. The BSI image sensor of claim 3, wherein a sidewall of another one of the second micro structures and the substrate-horizontal direction comprise a fourth included angle, and the fourth included angle is different from the second included angle.

8. The BSI image sensor of claim 1, further comprises:
    a first coating between the substrate and the color filter; and
    a second coating extends an entire surface of the front side of the substrate.

9. A back side illumination (BSI) image sensor comprising:
    a substrate comprising a front side and a back side opposite to the front side;
    a pixel sensor disposed in the substrate; and the pixel sensor comprising a plurality of first micro structures disposed over the back side of the substrate; and
    a color filter disposed over the pixel sensor, and the color filter comprising a plurality of second micro structures disposed over the back side of the substrate,
    wherein each of the first micro structures is different from each of the second micro structures.

10. The BSI image sensor of claim 9, wherein a height of each of the first micro structures is different from a height of the second micro structures.

11. The BSI image sensor of claim 9, wherein a shape of each of the first micro structures is different from a shape of each of the second micro structures.

12. The BSI image sensor of claim 9, wherein the first micro structures are arranged to form a first pattern, the second micro structures are arranged to form a second pattern, and the first pattern is different from the second pattern.

13. The BSI image sensor of claim 12, wherein the first pattern is symmetrical to a first axial, and the second pattern is symmetrical to a second axial.

14. The BSI image sensor of claim 13, wherein the first axial is aligned with the second axial.

15. A back side illumination (BSI) image sensor comprising:
    a substrate comprising a front side and a back side opposite to the front side;
    a photodiode disposed in the substrate;
    a color filter disposed over the back side of the substrate;
    a plurality of first micro structures disposed between the photodiode and the color filter;
    a plurality of second micro structures disposed over the front side of the substrate; and
    a dielectric layer disposed between adjacent second micro structures,
    where a surface of the dielectric layer and surfaces of the second micro structures form a flat surface over the front side of the substrate.

16. The BSI image sensor of claim 15, wherein a shape of each of the first micro structures is different from a shape of each of the second micro structures.

17. The BSI image sensor of claim 15, wherein a height of each of the first micro structures is different from a height of each of the second micro structures.

18. The BSI image sensor of claim 17, wherein the height of the first micro structures is greater than the height of the second micro structures.

19. The BSI image sensor of claim 15, further comprising a first coating between the color filter and the substrate.

20. The BSI image sensor of claim 15, further comprises a second coating disposed over the flat surface over the front side of the substrate.

* * * * *